United States Patent
Kawano

(10) Patent No.: US 9,544,014 B2
(45) Date of Patent: Jan. 10, 2017

(54) PULSE GENERATOR, SEMICONDUCTOR INTEGRATED CIRCUIT, AND WIRELESS DATA TRANSMISSION METHOD

(71) Applicant: FUJITSU LIMITED, Kawasaki-shi, Kanagawa (JP)

(72) Inventor: Yoichi Kawano, Setagaya, PA (US)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/963,270

(22) Filed: Dec. 9, 2015

(65) Prior Publication Data

US 2016/0094271 A1 Mar. 31, 2016

Related U.S. Application Data

(63) Continuation of application No. PCT/JP2013/067673, filed on Jun. 27, 2013.

(51) Int. Cl.
  *H04B 1/717* (2011.01)
  *H03K 3/01* (2006.01)

(52) U.S. Cl.
  CPC ............ *H04B 1/7174* (2013.01); *H03K 3/01* (2013.01)

(58) Field of Classification Search
  CPC .......... H04B 1/717; H04B 1/7174; H04K 3/01
  USPC ....................................... 375/130
  See application file for complete search history.

(56) References Cited

U.S. PATENT DOCUMENTS

| | | | | |
|---|---|---|---|---|
| 3,852,807 A | * | 12/1974 | Caprio | H04N 9/643 348/652 |
| 2006/0126592 A1 | | 6/2006 | Hassan et al. | |
| 2007/0194978 A1 | * | 8/2007 | Teshirogi | G01S 7/03 342/28 |
| 2008/0260019 A1 | * | 10/2008 | Aoyagi | G01S 7/282 375/239 |
| 2013/0010849 A1 | | 1/2013 | Shimizu et al. | |

FOREIGN PATENT DOCUMENTS

| | | |
|---|---|---|
| JP | 62-028908 | 2/1987 |
| JP | 2001-007875 | 1/2001 |
| JP | 2006-174473 | 6/2006 |
| JP | 2006-518142 | 8/2006 |
| JP | 2007-174087 | 7/2007 |
| JP | 2011-199614 | 10/2011 |
| WO | 2004-073195 | 8/2004 |

OTHER PUBLICATIONS

Phan et al., "Energy-Efficient Low-Complexity CMOS Pulse Generator for Multiband UWB Impulse Radio," IEEE Transactions on Circuits and Systems I: Regular Papers, vol. 55, Issue No. 11 (Dec. 2008), pp. 3552-3563 (12 pages).

(Continued)

*Primary Examiner* — Michael Neff
(74) *Attorney, Agent, or Firm* — Fujitsu Patent Center

(57) ABSTRACT

A pulse generator, which is configured to generate a burst pulse formed by burst oscillation signals oscillated in a predetermined time period, includes a burst oscillation circuit configured to generate the burst oscillation signals of different frequencies; and a control circuit configured to control the burst oscillation circuit so as to select the frequencies of the burst oscillation signals from at least two different frequencies or to stop the burst oscillation signals.

12 Claims, 16 Drawing Sheets

(56) References Cited

OTHER PUBLICATIONS

Paquelet et al., "An Impulse Radio Asynchronous Transceiver for High Data Rates," Joint UWBST & IWUWBS, IEEE (May 2004), pp. 1-5 (5 pages).
International Search Report and Written Opinion of the International Searching Authority (Form PCT/ISA/210, Form PCT/ISA/237), mailed in connection with PCT/JP2013/067673 and mailed Sep. 3, 2013, partial English translation (14 pages).
JPOA—Office Action of JP Patent Application No. 2015-523753 mailed Sep. 6, 2016, with partial English Translation of the Office Action. Remaining references cited in the JPOA were previously submitted in the IDS filed on Dec. 9, 2015.

* cited by examiner

FIG. 4
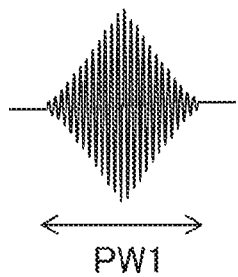
[IDEAL BURST PULSE]
PW1
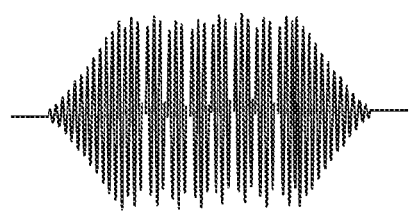
[GENERATION POSSIBLE BURST PULSE]
PW2
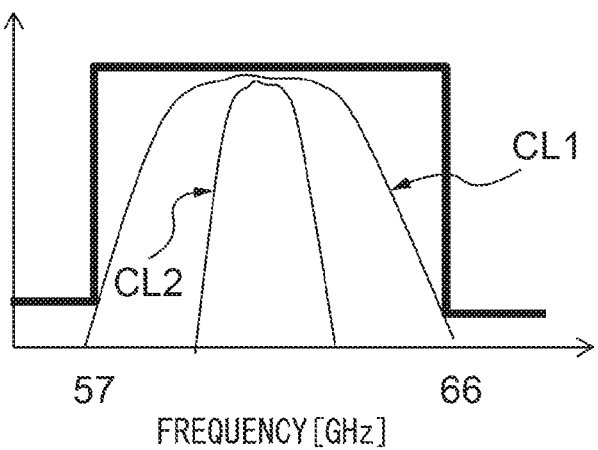
FIG. 5
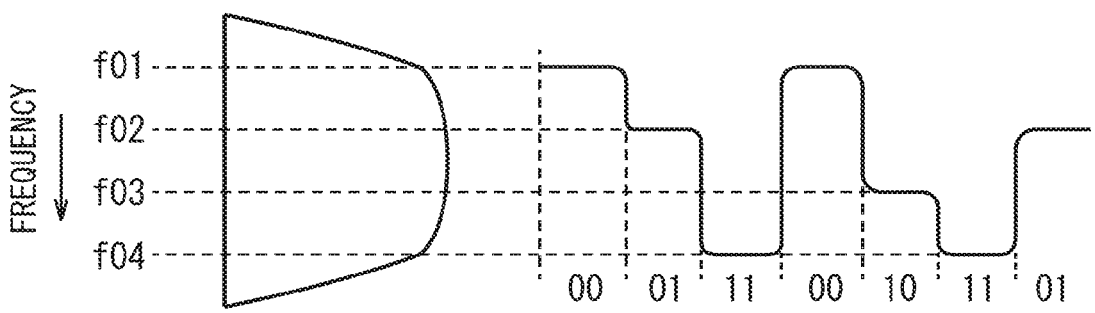

FIG. 8
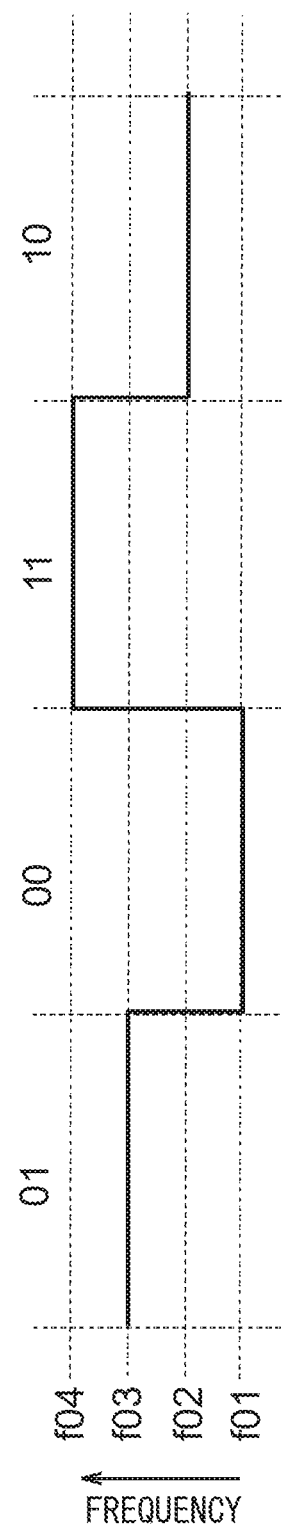
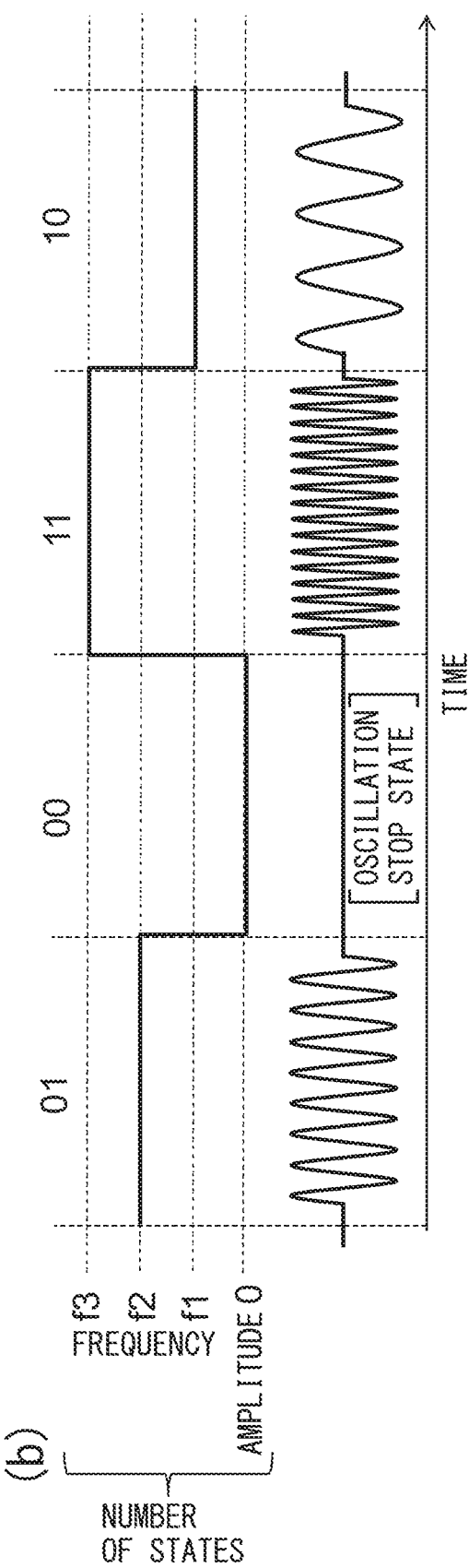

FIG. 18
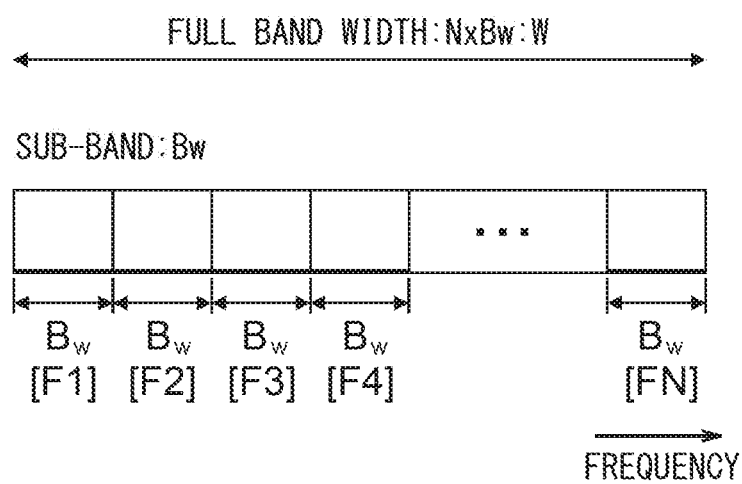
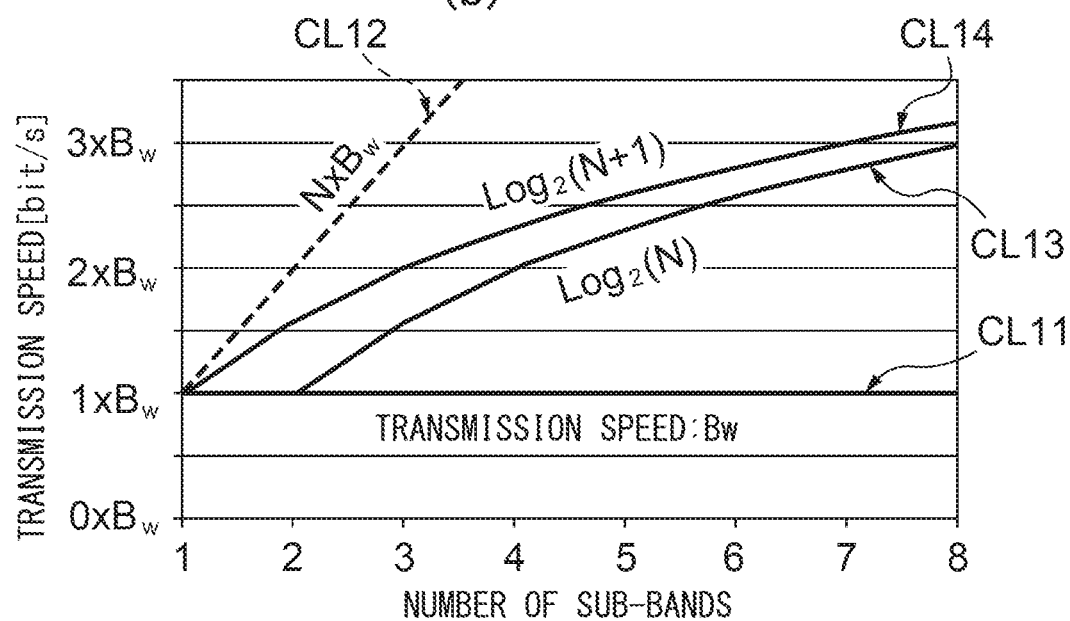

US 9,544,014 B2

PULSE GENERATOR, SEMICONDUCTOR INTEGRATED CIRCUIT, AND WIRELESS DATA TRANSMISSION METHOD

CROSS-REFERENCE TO RELATED APPLICATION

This application is a continuation application and is based upon PCT/JP2013/067673, filed on Jun. 27, 2013, the entire contents of which are incorporated herein by reference.

FIELD

Embodiments discussed herein relate to a pulse generator, a semiconductor integrated circuit, and a wireless data transmission method.

BACKGROUND

Recently, an ultra-wideband (UWB) communication system or an UWB radar have been sought and various technical solutions have been studied. For example, in the UWB communication system, a data transmission rate has been increased in accordance with a time width of a pulse (burst pulse), since a band width is enlarged in accordance with shortening of the time width of the burst pulse.

So as to realize data transmission of the UWB communication system, a burst oscillation circuit for generating a short pulse has been used as a signal source.

For example, in a wireless data transmission method using the short pulse as the signal source, a short pulse of which time width corresponds to data is generated and band-limited by a band-pass filter, and then a signal (burst pulse) corresponding to the data is output.

Further, in a wireless data transmission method using the burst oscillation circuit, the burst oscillation circuit is turned on/off control based on the burst control signal, and burst oscillation signals (burst pulse) are generated by operating a burst oscillation circuit in a predetermined time period.

As described above, the systems of using a short pulse as a signal source or of using a burst oscillation circuit have been used to perform the data transmission by the UWB communication.

Incidentally, in a wireless data transmission method using a burst oscillation circuit, so as to increase a transmission speed of data (data transmission rate), it is preferable to shorten a burst oscillation time (pulse width of the burst pulse). For example, in a pulse communication using frequencies of a 57 GHz to 66 GHz band allowed for a specified low-power radio station, an available bandwidth may be widened to at most 9 GHz band width.

In this case, since a pulse width of approximately 110 ps which is a reciprocal number of the bandwidth may be used as a pulse width, in a manner of transmitting data by on/off of the burst oscillation circuit (burst pulse), a 9 Gbps data transmission may be realized in accordance with the frequency band width occupied by the burst pulse.

However, in existing semiconductor devices, particularly, in highly versatile CMOS elements, it is difficult to shorten the time width of the burst pulse to 110 ps. Such a problem is not only included in the specified low-power radio stations of the 57 GHz to 66 GHz band, but, for example, UWB (mainly, for a user terminal) using a 3 GHz to 10 GHz band, and a mission-critical wireless communication using a 70 GHz to 80 GHz band and an 80 GHz to 90 GHz, and the like.

Specifically, in the above described wireless data transmission method, it is not possible to effectively use the bandwidth, and it is difficult to sufficiently secure the data transmission rate.

Conventionally, various techniques for a pulse generator applied to a UWB communication or UWB radar, or techniques for transmitting data by frequencies in correspondence with data have been proposed.

Patent Document 1: Japanese Laid-open Patent Publication No. 2007-174087

Patent Document 2: Japanese Laid-open Patent Publication No. S62-028908

Non-Patent Document 1: Tuan-Anh Phan et al., "A 18-pJ/Pulse OOK CMOS Transmitter for Multiband UWB Impulse Radio," IEEE Microwave and Wireless Components Letters, Vol. 17, No. 9, September 2007

SUMMARY

According to an aspect of the embodiments, there is provided a pulse generator configured to generate a burst pulse formed by burst oscillation signals oscillated in a predetermined time period, including a burst oscillation circuit, and a control circuit.

The burst oscillation circuit is configured to generate the burst oscillation signals of different frequencies, and the control circuit is configured to control the burst oscillation circuit so as to select the frequencies of the burst oscillation signals from at least two different frequencies or to stop the burst oscillation signals.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram for explaining problems in the wireless data transmission method depicted in FIG. 3;

FIG. 5 is a diagram for explaining a wireless data transmitting method of assigning data codes to different frequencies;

FIG. 8 is a diagram for explaining a wireless data transmission method of the present embodiment by comparing to the wireless data transmission method described with reference to FIG. 5;

FIG. 18 is a diagram for explaining an effect of each embodiment of the pulse generator.

DESCRIPTION OF EMBODIMENTS

First, before describing embodiments of a pulse generator, a semiconductor integrated circuit, and a wireless data transmission method, an example of an ultra-wideband (UWB) communication system, and an example of a pulse generator and problems thereof are described with reference to FIG. 1 to FIG. 6.

Figure 1:
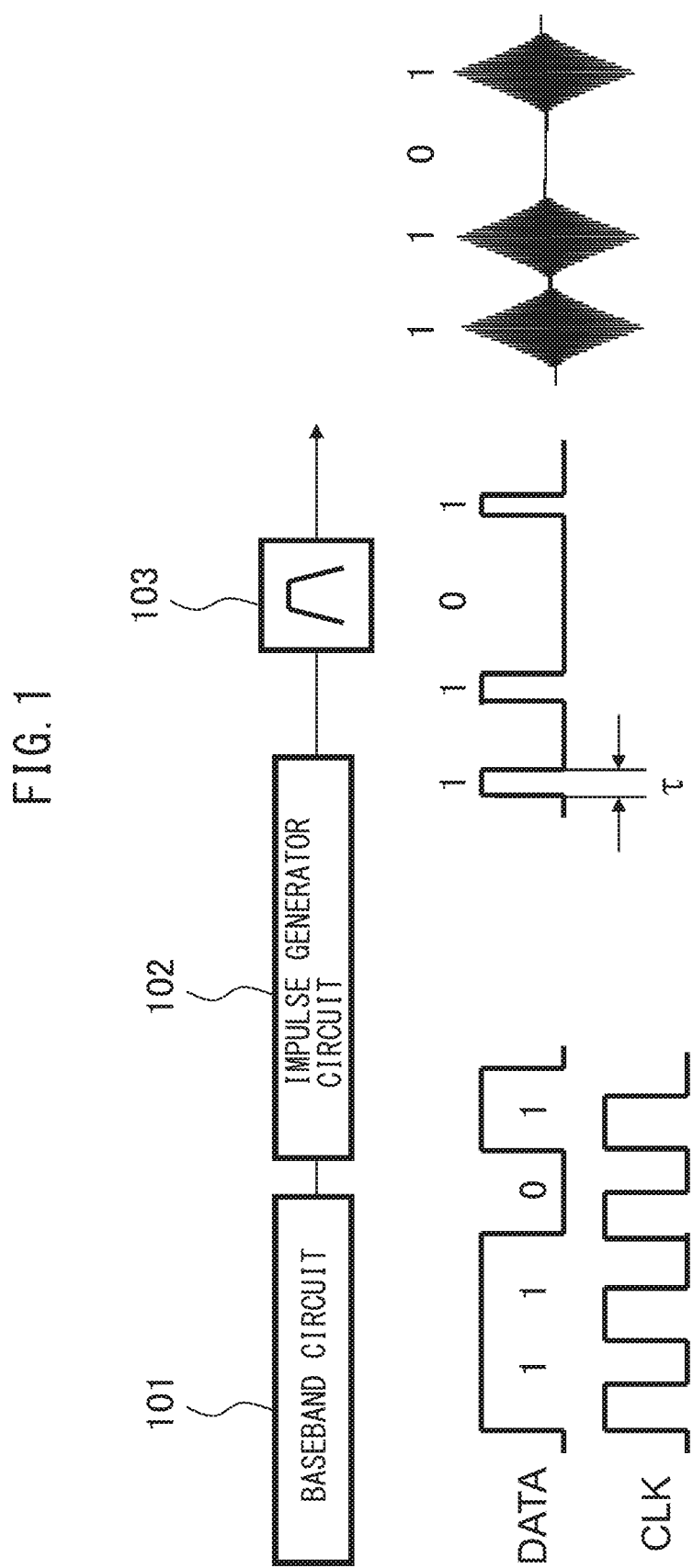
FIG. 1 is a diagram for explaining an example of an ultra-wideband communication system.

FIG. 1 is a diagram for explaining an example of an ultra-wideband communication system, and indicates the ultra-wideband communication system using a short pulse as a signal source. In FIG. 1, reference numeral 101 denotes a base band circuit, 102 denotes an impulse generator circuit, and 103 denotes a band-pass filter. Note that, a pulse generator for generating a burst pulse formed by a burst frequency includes an impulse generator circuit 102 and band-pass filter 103.

As depicted in FIG. 1, in the UWB (Ultra Wide Band) communication system using the short pulse as the signal source, for example, the baseband circuit 101 processes a baseband signal before modulating and generated from data DATA ("1101 . . . "), and outputs to the pulse generator circuit 102.

The impulse generator circuit 102 generates, for example, a short pulse including a time width τ corresponding to the data "1101 . . . ," and further, after being band-limited by the band-pass filter 103, a signal (burst pulse) corresponding to the data "1101 . . . " is output.

Figure 2:
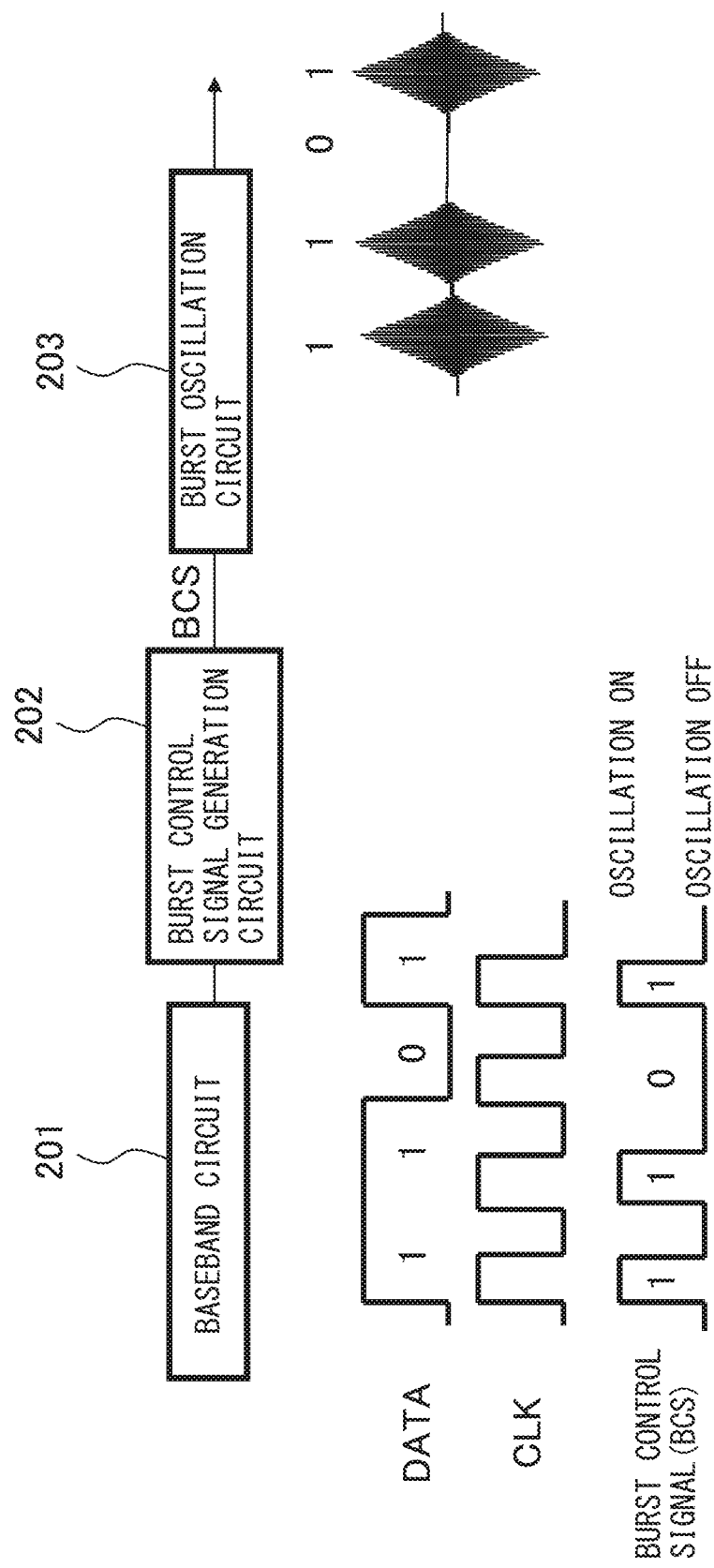
FIG. 2 is a diagram for explaining another example of the ultra-wideband communication system.

FIG. 2 is a diagram for explaining another example of the ultra-wideband communication system, and illustrates an ultra-wideband communication system using a burst oscillation circuit which only oscillates in a predetermined time. In FIG. 2, reference numeral 201 denotes a base band circuit, 202 denotes a burst control signal generation circuit, and 203 denotes a burst oscillation circuit.

As depicted in FIG. 2, in the UWB communication system using the burst oscillation circuit, the baseband circuit 201 processes a baseband signal which is generated from the data DATA ("1101 . . . "), and outputs the baseband signal to the burst control signal generation circuit 202.

The burst control signal generation circuit 202 generates, for example, a burst control signal BCS corresponding to the data "1101 . . . " and outputs to the burst oscillation circuit 203.

The burst oscillation circuit 203 is controlled in accordance with the burst control signal BCS, for example, the burst oscillation circuit 203 generates an oscillation when the BCS is "H" (oscillation is on), and stops the oscillation when the BCS is "L" (oscillation is off). Accordingly, burst pulses corresponding to the data "1101 . . . " is output.

Figure 3:
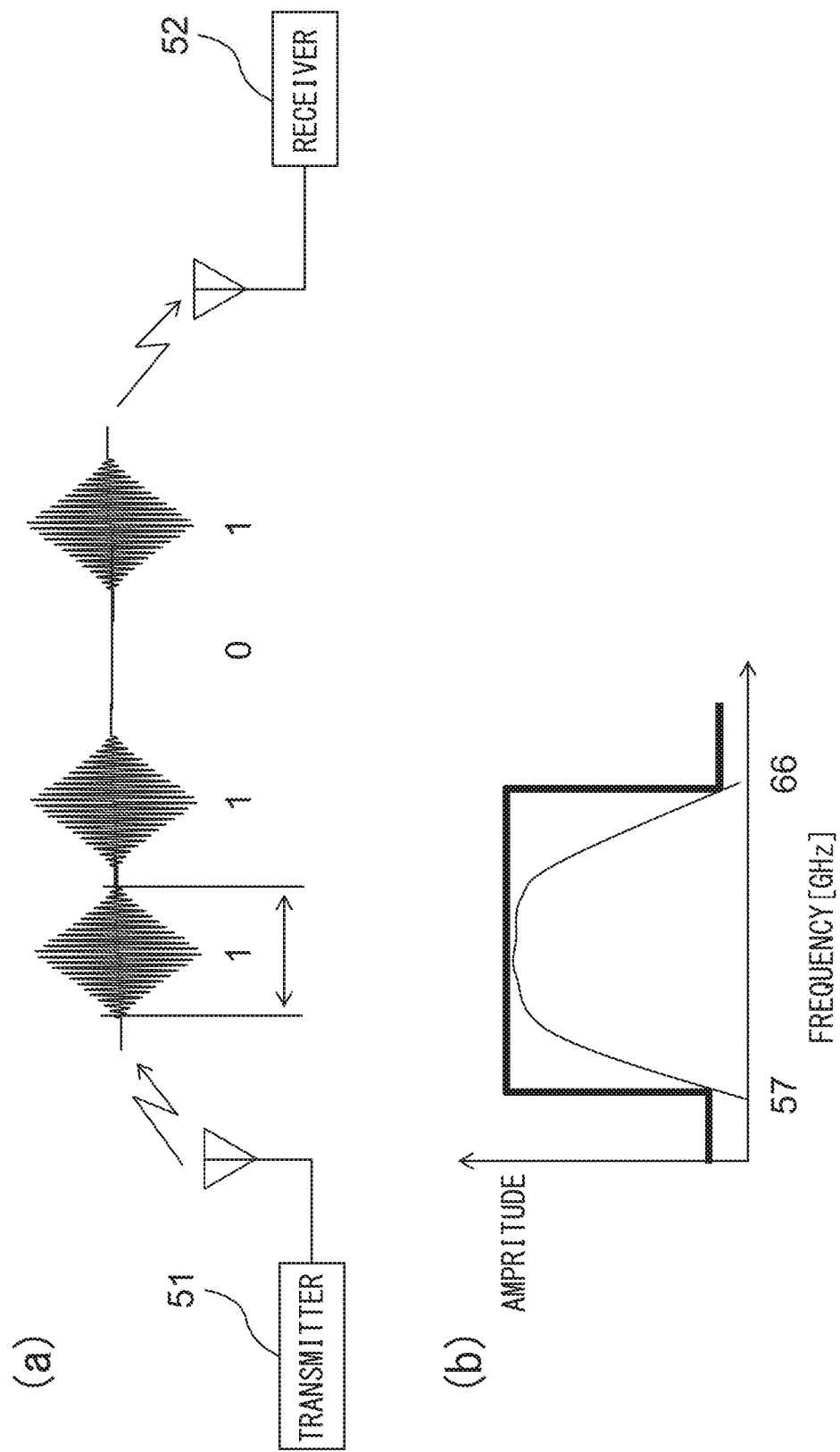
FIG. 3 is a diagram for explaining an example of a wireless data transmission method according to the ultra-wideband communication system.

FIG. 3 is a diagram for explaining an example of a wireless data transmission method according to the ultra-wideband communication system, and FIG. 4 is a diagram for explaining problems in the wireless data transmission method depicted in FIG. 3. Note that, FIG. 3(*a*) schematically illustrates the wireless data transmission from the transmitter to the receiver, and FIG. 3(*b*) is a diagram for explaining an application to a specified low-power radio station of a 57 GHz to 66 GHz band.

As depicted in FIG. 3(*a*), in the UWB communication scheme, a transmitter 51 transmits a binary data of "0" or "1" to a receiver 52 based on a presence or an absence of a burst oscillation pulse. This is a general UWB (Ultra Wide Band) communication system.

As described above, for example, when frequencies of the 57 GHz to 66 GHz band are applied to the specified low-power radio station, an approximate 110 ps is used as a burst pulse width, and a high-speed data transmission of 9 Gbps may be realized.

However, it is difficult to realize a burst pulse including a pulse width of 110 ps by using, for example CMOS devices. That is, as depicted in FIG. 3(*b*) and FIG. 4, it is difficult to generate a UWB pulse including a wide band of 9 GHz by using general in CMOS technologies.

Specifically, in the 57 GHz to 66 GHz band, if an ideal burst pulse including a pulse width PW1 of 110 ps is generated, it is possible to realize a data transmission of 9 Gbps as illustrated in a curve CL1.

However, an actual pulse width PW2 of a generation possible burst pulse is, for example, about several hundred ps which is much larger than the ideal pulse width PW1. Therefore, as illustrated in a curve CL2, it is difficult to realize a data transmission of a data transmission rate (9 Gbps) calculated from a bandwidth of 9 GHz.

Such a problem not only exists in the specified low-power radio stations of the 57 GHz to 66 GHz band, but also exists in, for example, the UWB using a 3 GHz to 10 GHz band, as well as, a 70 GHz to 80 GHz band and a 80 GHz to 90 GHz band.

Specifically, embodiments of a pulse generator, a semiconductor integrated circuit and a wireless data transmission method described below in detail are not only applied to a 57 GHz to 66 GHz band, but also applied to, for example, a 3 GHz to 10 GHz band, a 70 GHz to 80 GHz band and a 80 GHz to 90 GHz band.

Figure 6:
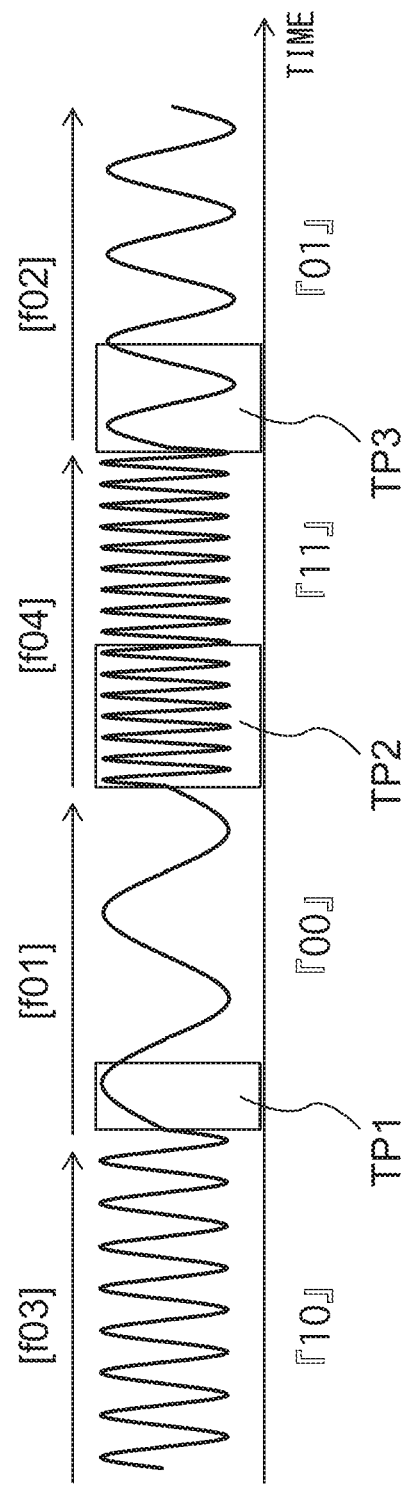
FIG. 6 is a diagram for explaining the problems in the wireless data transmission method depicted in FIG. 5.

FIG. 5 is a diagram for explaining a wireless data transmitting method of assigning data codes to different frequencies, and FIG. 6 is a diagram for explaining the problems in the wireless data transmission method.

The wireless data transmission method depicted in FIG. 5, does not use a pulse communication, such as UWB, but uses a carrier (continuous waves) and performs a communication by modulating the carrier, i.e., performs the communication by associating data to different frequency signals.

Specifically, the wireless data transmission method depicted in FIG. 5, performs a wireless data transmission by assigning four different frequencies f01, f02, f03 and f04 to two-bit codes (multi-valued data) "00", "01", "10" and "11".

Concretely, as depicted in FIG. 6, for example, when transmitting data "10", "00", "11" and "01", the frequency is changed as f03→f01→f04→f02 by using a voltage controlled oscillator (VCO), and the like.

In this case, the frequency corresponding to the data may not be immediately changed, for example, a transition period TP1 may be caused when the frequency is changed from f03 to f01, a transition period TP2 may be caused when the frequency is changed from f01 to f04, and a transition period TP3 may be caused when the frequency is changed from f04 to f02.

Note that, time lengths of the transition periods TP1 to TP3 are determined, for example, depending on a difference (hopping width) in frequencies which change before and after the transition period, and the time lengths of the transition periods TP1 to TP3 become longer when the difference in frequencies is large. The data transmission is performed by using only areas where a carrier frequency is stable without including transition periods (unstable areas), which means causing an intersymbol-interference between the data.

Specifically, in the transition periods TP1 to TP3, it is not possible to perform data transmission correctly, and thus a data transmission rate is lowered.

Figure 7:
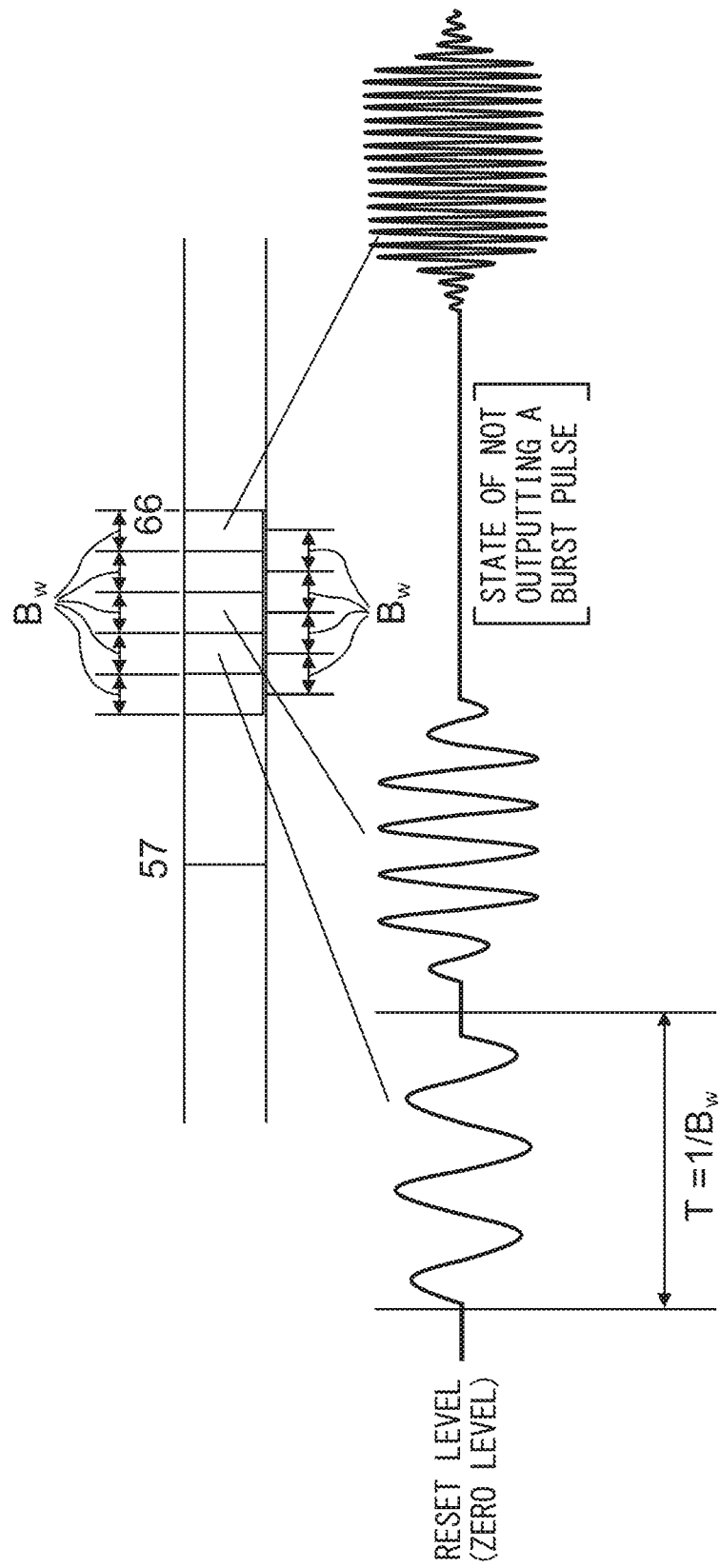
FIG. 7 is a diagram for explaining an embodiment of a wireless data transmission method.

Below, embodiments of a pulse generator, a semiconductor integrated circuit, and a wireless data transmission method will be explained in detail with reference to the attached drawings. FIG. 7 is a diagram for explaining an embodiment of a wireless data transmission method.

As depicted in FIG. 7, in a wireless data transmission method of the present embodiment, for example, a band width (full band) W using a 57 GHz to 66 GHz band is not realized by one pulse, but realized by a plurality of sub-bands which are divided from the full band, wherein a band width Bw of one band (sub-band) may be narrowed.

In this case, a pulse time width (width of an envelope of the burst pulse) T, which is a time interval of burst oscillations, is determined by 1/Bw (T=1/Bw). Further, a time width between frequencies of adjacent sub-bands is the same as Bw or an integral multiple of Bw.

Therefore, a width (time width of burst oscillating pulse) T of each of the burst pulses is the same as 1/Bw, but an oscillation frequency of each of the burst pulses are different from each other. Note that, when the oscillation is terminated, the burst pulse is reset to a reset level (non-signal state).

Specifically, it may be possible to identify what kind of the sub-band pulse is received based on a difference in frequencies of the burst pulses. Thereby, not only transmitting a binary data of "0" and "1" by presence or absence of a burst pulse, but also improving a data transmission rate, for example, by hopping a pulse based on a plurality of different frequencies, such as f1, f2 and f3.

Note that, in the wireless data transmission method described with reference to FIG. 5 and FIG. 6, carrier components may be always included in an output signal, since a carrier is modulated by a frequency modulation, and a non-signal state (oscillation stop state: state of fixing a voltage at 0V) may not be utilized.

In contrast, in the wireless data transmission method of the present embodiment, data (for example, data "0") is applied to the oscillation stop state, since the oscillation stop state of not outputting a burst pulse is generated.

As described above, according to the wireless data transmission method of the present embodiment, for example, a sufficient data transmission speed (data transmission rate) may be obtained, while using pulses including a long pulse width to which general CMOS technologies are applied.

Further, according to the wireless data transmission method of the present embodiment, for example, in a wireless data transmission method for assigning data codes to different frequencies, it is possible to avoid a decrease in data rate caused by an intersymbol-interference. Furthermore, according to the wireless data transmission method of the present embodiment, data may be also assigned to an oscillation stop state wherein a burst pulse is not output.

FIG. 8 is a diagram for explaining a wireless data transmission method of the present embodiment by comparing to the wireless data transmission method described with reference to FIG. 5. Note that, FIG. 8(a) is explains the wireless data transmission method described with reference to FIG. 5, and FIG. 8(b) explains the wireless data transmission method of the present embodiment.

As depicted in FIG. 8(a), in the wireless data transmission method described with reference to FIG. 5, for example, two-bit multi-value data "00", "01", "10" and "11" are assigns to four different frequencies f01, f02, f03 and f04, and the multi-value data are wirelessly transmitted. Note that, a transmission waveform is constantly vibrated as the carrier is vibrated by a frequency modulation.

In contrast, as depicted in FIG. 8(b), in the wireless data transmission method of the present embodiment, an oscillation stop state (non-oscillating state) may be also used, since a burst signal (burst pulse) oscillating a predetermined time is used. Concretely, data "00" is assigned to the oscillation stop state, and data "01", "10" and "11" are assigned to the frequencies f1, f2 and f3, respectively.

Specifically, according to the wireless data transmission method of the present embodiment, for example, it is possible to realize the 2-bit multilevel only by using three frequencies f1 to f3. This means that, in the case of using the same bandwidth, a data transmission rate may be improved with respect to those using four frequencies f01 to f04 for the 2-bit multilevel.

Further, according to the wireless data transmission method of the present embodiment, intersymbol-interference problems which are explained with reference to FIG. 5 and FIG. 6, may be avoided by using a burst pulse (pulse of burst oscillating).

Incidentally, as described above, when the oscillation is terminated, the burst pulse is reset to a non-signal state (reset level). Specifically, according to the wireless data transmission method of the present embodiment, a transmit pulse of each of different frequencies is always changed from the same initial value (reset level) to a frequency fn (n=1, 2, 3, . . . ), and thus frequency unstable areas (transition periods TP1 to TP3 depicted in FIG. 6) may not exist.

Figure 9:
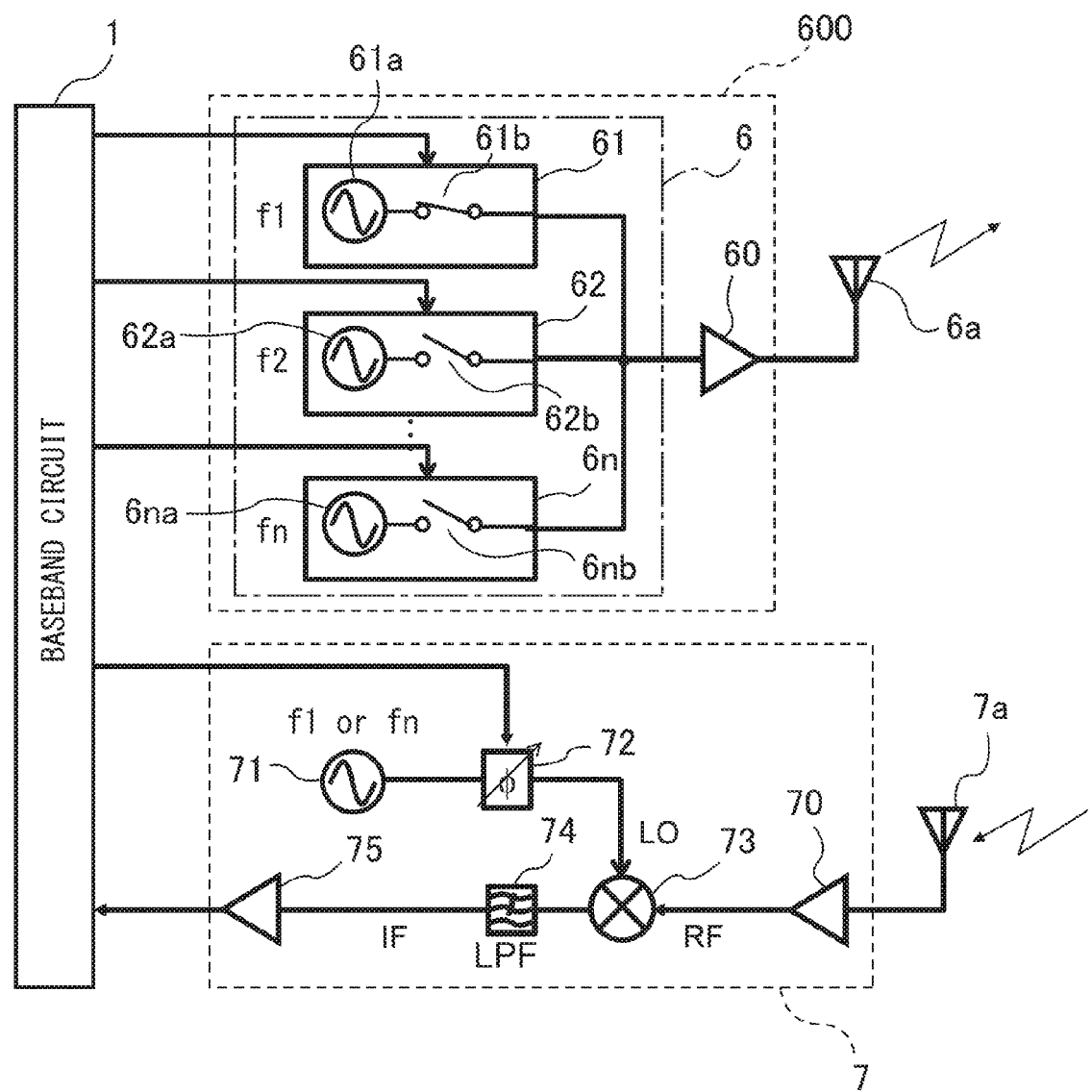
FIG. 9 is a block diagram for explaining an example of a transceiver including a transmitting section to which a first embodiment of a pulse generator is applied.

FIG. 9 is a block diagram for explaining an example of a transceiver including a transmitting section to which a first embodiment of a pulse generator is applied. In FIG. 9, reference numeral 1 denotes a baseband circuit, 600 denotes a transmitting section, 6 denotes a pulse generator, 61 to 6n denote burst oscillation units, 60 denotes a power amplifier, and 6a denotes a transmitting antenna.

Further, reference numeral 7 denotes a receiving section, 70 denotes a low-noise amplifier, 71 denotes a local oscillation circuit, 72 denotes a variable phase shifter, 73 denotes a mixer circuit, 74 denotes a low-pass filter (LPF), and 75 denotes an IF amplifier (limiter amplifier).

As depicted in FIG. 9, the transceiver includes the baseband circuit 1, the transmitting section 600, and the receiving section 7. The baseband circuit 1 generates baseband pulses corresponding to a plurality of frequency sub-bands, for example, by controlling the transmitting section 600 according to data to be transmitted, and processes high-frequency signals (baseband pulses) received and demodulated by the receiving section 7.

The transmitting section 600 includes the burst oscillation units 61 to 6n for generating and outputting a plurality of different burst signals (burst pulses) of frequencies f1 to fn corresponding to a plurality of different sub-bands, and the power amplifier 60 for amplifying output signals of the burst oscillation units 61 to 6n. Note that, the pulse generator 6 includes the burst oscillation units 61 to 6n.

The burst oscillation units 61 to 6n include oscillators 61a to 61na, and switches (second switch) 61b to 61nb of frequency f1 to fn corresponding to the sub-bands, respectively. The baseband circuit 1 controls the switches 61b to 61nb, and selects any of outputs of the oscillators 61a to 61na.

Note that, for example, the oscillators 61a to 61na of the burst oscillation units 61 to 6n correspond to a burst oscillation circuit 3 which will be described in later with reference to FIG. 10, and the switches 61b to 61nb correspond to a burst control signal generation circuit (control circuit) 2.

Specifically, any one of the switches of the burst oscillation units 61 to 6n is selected (turned on) by a control signal output from the baseband circuit 1, and an output signal of the selected burst oscillation unit is amplified by the power amplifier 60 and transmitted from the antenna 6a.

Note that, when all switches of the burst oscillation units 61 to 6n are unselected (turned off) by the control signal output from the baseband circuit 1, the pulse generator is an oscillation stop state (non-oscillating state). As described above, predetermined data is assigned to the oscillation stop state.

In the receiving section 7, a radio frequency signal received by the receiving antenna 7a is amplified by the low-noise amplifier 70, and then the radio frequency signal (baseband pulse) RF is processed (detected) by the mixer circuit 73 using a local signal (local oscillation signal) LO.

Note that, the local signal LO is obtained by phase variable processing an output signal of the local oscillation circuit 71 using the variable phase shifter 72. The detailed explanations of the variable phase shifter 72 will be described in detail later with reference to FIG. 15.

The oscillation frequency of the local oscillation circuit 71, i.e., the frequency of the local signal LO is set to, for example, the lowest frequency or the highest frequency in frequencies of a plurality of sub-bands. In other words, the frequency of the local signal LO is the lowest frequency (for example, f1) or the high frequency (for example, fn) in the oscillation frequencies f1 to fn of the burst oscillation units 61 to 6n.

The IF amplifier 75 performs waveform shaping (shaping) of an envelope of the intermediate frequency signal (IF) filtered by the low-pass filter 74 to a rectangular waveform and outputs the shaped signal to the baseband circuit 1. Therefore, a high gain amplifier is applied to the IF amplifier 75 is determined, for example, a limiter amplifier may be applied thereto.

Further, the variable phase shifter 72 is used for outputting a local signal LO to the mixer circuit 73 by controlling the output signal of the phase of the local oscillation circuit 71, and a variable phase amount caused by the variable phase shifter 72 is controlled by the baseband circuit 1.

Incidentally, the pulse generator 6 (burst oscillation units 61 to 6n) of the first embodiment in the transmitting section 600 of the transceiver depicted in FIG. 9 continuously performs oscillation operations, and thus the first embodiment may include a disadvantage of power consumption.

Figure 10:
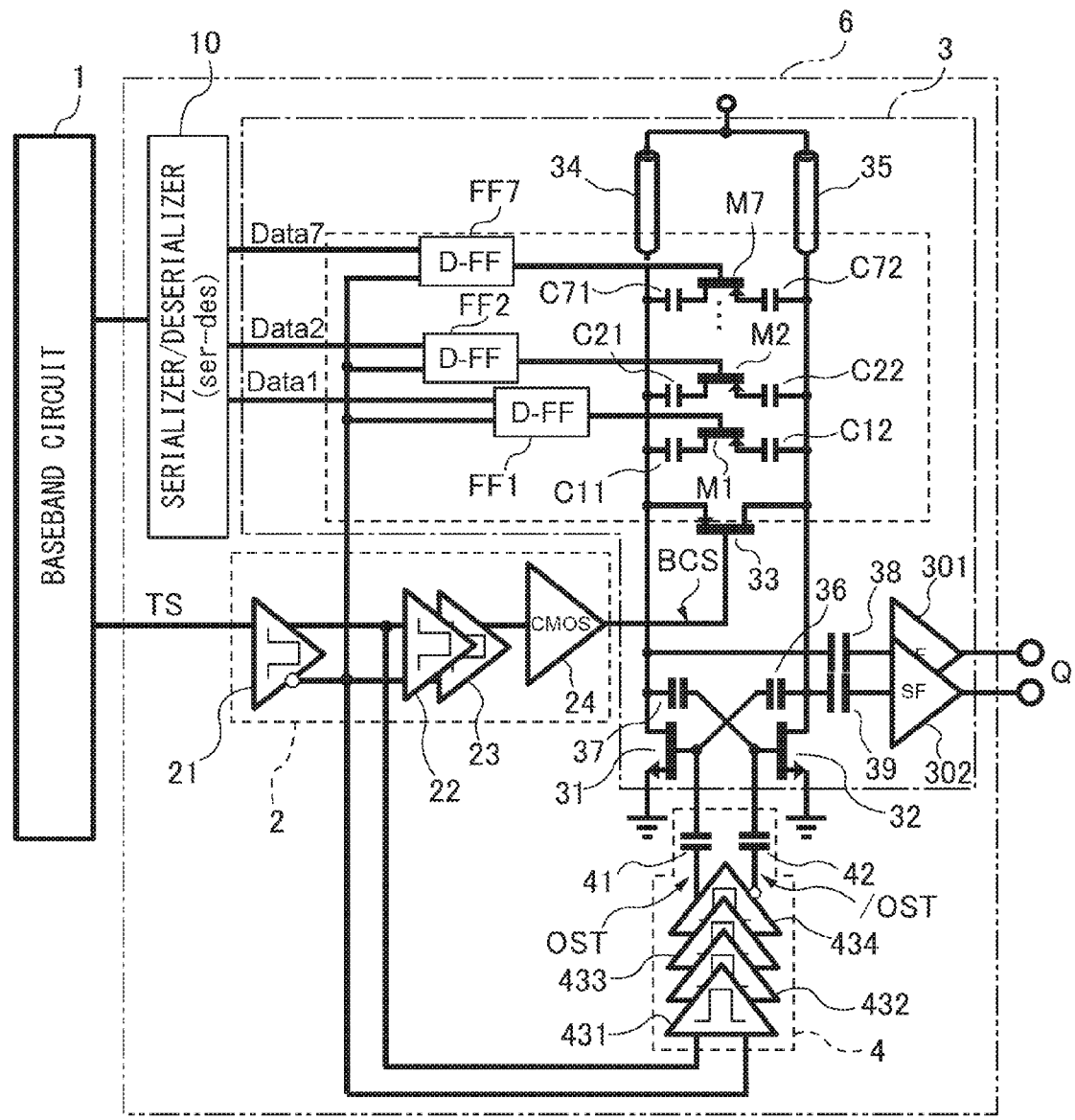
FIG. 10 is a circuit diagram illustrating a second embodiment of the pulse generator.

FIG. 10 is a circuit diagram illustrating a second embodiment of the pulse generator. Note that, FIG. 10 illustrates an example arrangement based on a differential cross-coupled oscillator, but the present embodiment is not limited thereto.

As depicted in FIG. 10, the pulse generator 6 of the second embodiment includes a serializer/deserializer (serdes) 10, a burst control signal generation circuit 2, a burst oscillation circuit 3, and an oscillation-start-trigger generation circuit 4. Note that, the serializer/deserializer 10 may be incorporated in the baseband circuit 1.

The burst oscillation circuit 3, includes nMOS transistors 31, 32, a pMOS transistor (first switch) 33, load elements 34, 35, and capacitors 36 to 39. Further, the burst oscillation circuit 3 includes delay flip-flops (D-FFc) FF1 to FF7, pMOS transistors M1 to M7, and capacitors C11, C12 to C71, C72.

Each of gates and drains of the transistors 31 and 32 are cross-connected via the capacitors 36 and 37, and an output signal Q is output from the drain of the transistor 31 via the capacitor 38 and a buffer circuit 301. Further, an output signal Q is output from the drain of the transistor 32 via the capacitor 39 and a buffer circuit 302.

The transistor 33 is provided between differential terminals of the burst oscillation circuit (differential amplifier circuit) 3, and is functioned as a switch element for controlling an oscillation in response to a burst control signal BCS input to a gate of the transistor 33.

Specifically, the burst oscillation circuit 3 is set to an oscillation state (oscillation possible state) by turning off the transistor 33 when the burst control signal BCS is at a high level "H", and the burst oscillation circuit 3 is set to a non-oscillation state by turning on the transistor 33 when the burst control signal BCS is at a low level "L". Specifically, when the burst control signal BCS is at "L", the transistor 33 is turned on, the differential terminals of the burst oscillation circuit (differential amplifier circuit) are short-circuited, and the oscillation of the burst oscillation circuit is stopped.

The oscillation-start-trigger generation circuit 4 includes capacitors 41, 42 and four stages differential amplifiers 431 to 434, and differential signals (oscillation-start-trigger signals) OST, /OST are output to gates (differential input terminals) of a differential pair transistors 31 and 32 via the capacitors 41, 42. Note that, the signal /OST indicates an inverted logic signal of the signal OST.

The oscillation start trigger signal OST (/OST) is immediately changed from "L" to "H", after the burst control signal BCS input to the gate of the transistor 33 is changed from "L" to "H". Further, by changing the oscillation-start-trigger signal OST, /OST input to control terminals (gates) of the differential pair transistors 31, 32, an oscillation of the burst oscillation circuit 3 is forced to be started.

Note that, the capacitors 41, 42 are inserted between an output of the differential amplifier 434 and the gates of the differential pair transistors 31, 32, since DC signal components are unnecessary, and the oscillation-start-trigger signals OST, /OST are used to start the oscillation of the burst oscillation circuit 3.

The burst control signal generation circuit 2 is functioned as a control circuit for controlling the oscillation of the burst oscillation circuit 3 together with the serializer/deserializer 10, and the burst control signal generation circuit 2 includes three stages differential amplifiers 21 to 23 and CMOS amplifier 24. In the burst control signal generation circuit 2, for example, the first-stage differential amplifier 21 receives a transmission signal TS output from the baseband circuit 1, and outputs differential output signals to the differential amplifier 22 and the oscillation-start-trigger generation circuit 4.

Specifically, the output signal of the first-stage differential amplifier 21 is amplified by the four stages differential amplifiers 431 to 434 of the oscillation-start-trigger generation circuit 4, and outputs as the oscillation-start-trigger signals OST, /OST which include steep rising edges. The oscillation-start-trigger signals OST, /OST are input to the gates of the differential pair transistors 31, 32 via capacitors 41, 42.

Note that, the differential amplifiers of the oscillation-start-trigger generation circuit 4 are considered and determined to four stages by considering the timing of switching the transistor 33 which is controlled with a delay time by the two stage differential amplifiers 22, 23 and the CMOS amplifier 24.

The serializer/deserializer 10 is functioned as a control circuit for controlling the burst oscillation circuit 3 together with the burst control signal generation circuit 2. The serializer/deserializer 10 may convert serial data (transmitting data) output from the baseband circuit 1 into parallel data (Data 1 to Data 7), and outputs to the flip-flops FF1 to FF7, respectively.

Note that, according to the present embodiment, in the three-bit parallel data, an oscillation stop state of the pulse generator 6 (burst oscillation circuit 3) is used as another data other than the data Data 1 to Data 7. Specifically, three-bit multi-value data may correspond to burst pulses of different seven kinds of frequencies, and an oscillation stop state (burst pulse which is fixed at a reset potential).

As described above, the oscillation stop state may be realized by setting the burst control signal BCS at "L" to turn on the transistor 33, and short-circuiting the differential terminals (between drains of the transistors 31 and 32) of the differential amplifier circuit (3).

In the pulse generator 6 of the second embodiment depicted in FIG. 10, so as to change the frequency of the burst oscillation circuit 3 (a burst pulse), connections of the capacitors C11, C12 to C71, C72 are controlled by turning on/off the transistors M1 to M7 based on the outputs of the flip-flops FF1 to FF7.

For example, when the transistors M1 to M7 are turned on, a composite capacitance of the capacitors C11, C22 to C71, C72 connected in series between the differential terminals (between source-drain of the transistor 33: between drains of the transistors 31 and 32) is determined to $C_0$.

Specifically, when the transistor M1 is turned on, capacitance $1 \times C_0$ is given between the differential terminals by the capacitors C11 and C12 connected in series, and when the transistors M1 and M2 are turned on, $2 \times C_0$ is given between the differential terminals. Further, when all of the transistors M1 to M7 are turned on, capacitance $7 \times C_0$ is given between the differential terminals.

Note that, the above described examples are the case where capacitances of all capacitors C11, C12 to C71, C72 are the same value, however, a weight (for example, exponentiation weight) of the combined capacitance of the capacitors connected in series between the differential terminal (for example, exponentiation weight) may be possible to control.

Figure 11:
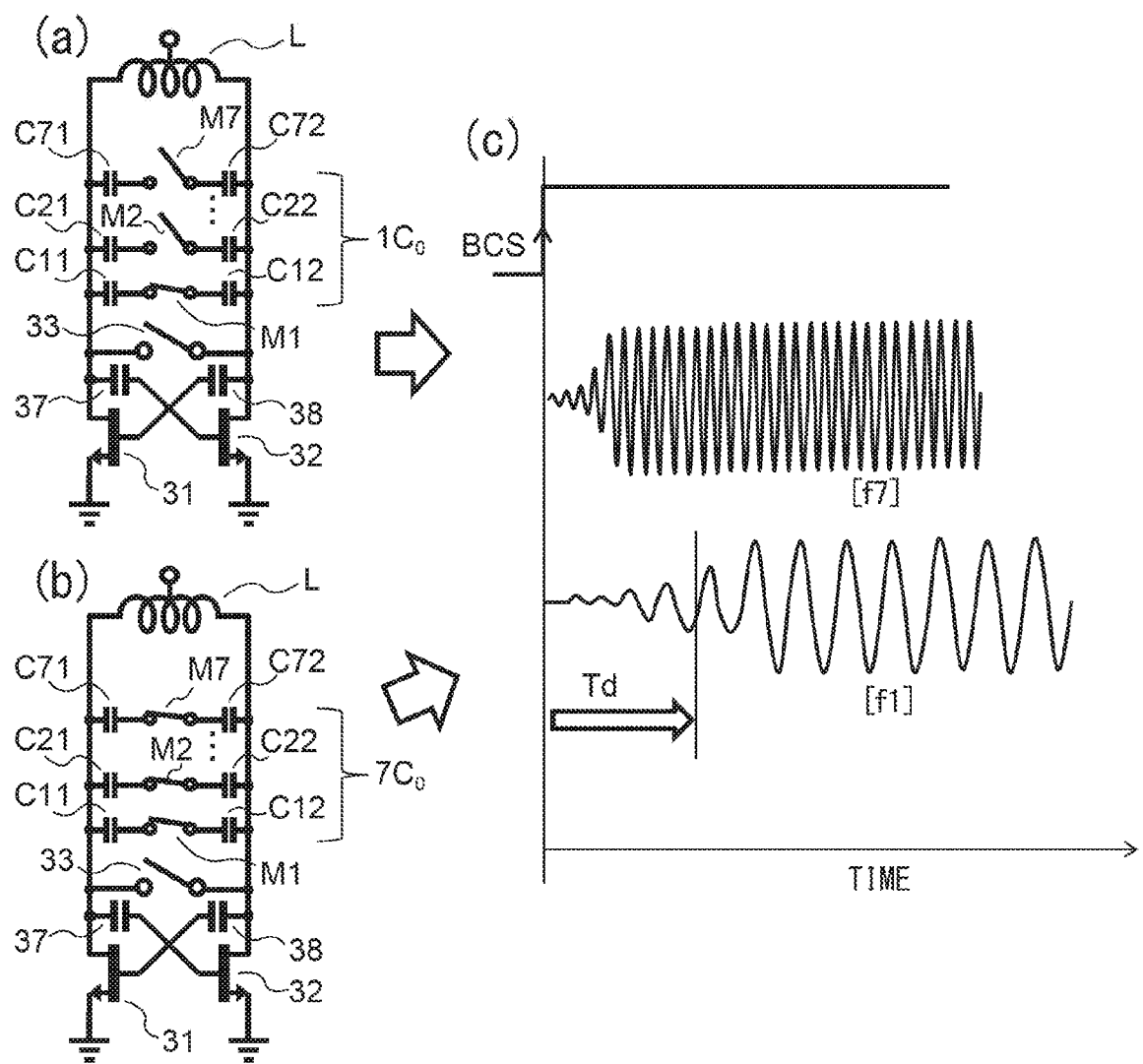
FIG. 11 is a diagram for explaining an amplitude growth in the pulse generator depicted in FIG. 10.
Figure 12:
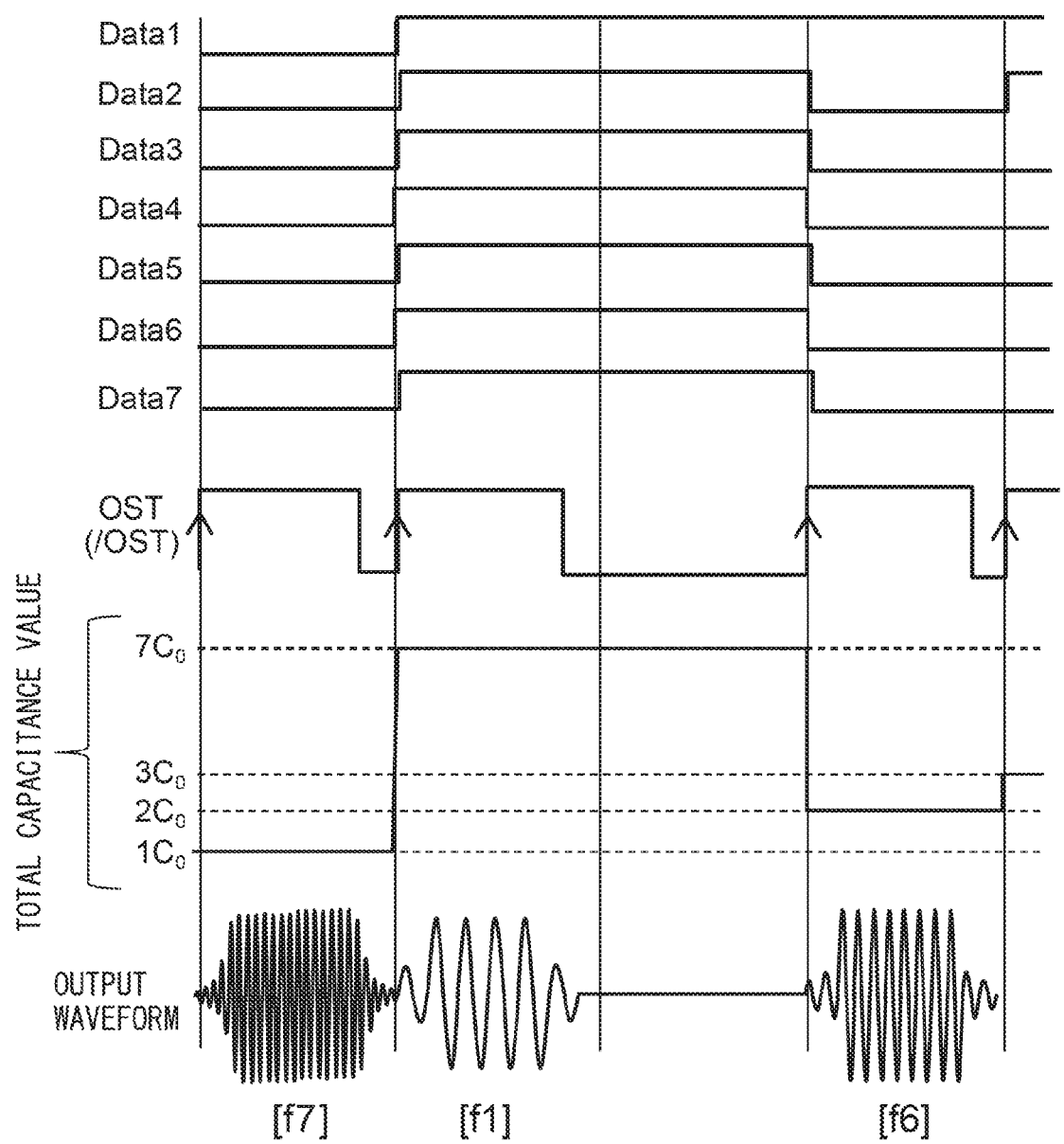
FIG. 12 is a timing chart for explaining an operation of the pulse generator depicted in FIG. 10.

FIG. 11 is a diagram for explaining an amplitude growth in the pulse generator depicted in FIG. 10, and FIG. 12 is a timing chart for explaining an operation of the pulse generator depicted in FIG. 10.

Note that, FIG. 11(a) indicates the case where the oscillation frequency is at f7 (highest frequency), FIG. 11(b) indicates the case where the oscillation frequency is at f1 (the lowest frequency), and FIG. 11(c) indicates amplitude growth of those cases. Note that, FIG. 11(a) and FIG. 11(b) illustrate inductance component as an L by omitting the load elements 34 and 35 of FIG. 10.

First, as depicted in FIG. 11(a), when the oscillation frequency generates a burst pulses f7, for example, one transistor (switch) M1 is only turned on, so that the capacitors C11, C12 are connected between the differential terminals (between source-drain of the transistor 33). Therefore, a capacitance $C_0$ is given between the differential terminals, and burst pulses base on the highest frequency f7 may be generated.

Next, as depicted in FIG. 11(b), when the oscillation frequency generates a burst pulses f1, for example, all transistors M1 to M7 are turned on, so that the capacitors C11, C12 to C71, C72 are connected between the differential terminals. Therefore, a capacitance $7C_0$ is given between the differential terminals, and burst pulses base on the lowest frequency f1 may be generated.

Incidentally, the stopped state of the oscillation pulse generator (burst oscillation circuit) may not generate immediately after the burst control signal BCS is changed from "L" to "H" and the transistor 33 turned off, and the oscillation pulse generator may start an oscillation by a trigger of thermal disturbances (random), and the like.

Therefore, as depicted in FIG. 11(c), in the case of oscillating by a low frequency (f1), the oscillation pulse generator starts an oscillation after a delay time Td from the burst control signal BCS raises to "H". This delay time Td may increase a pulse time width of the burst pulse.

Further, for example, impedance $(LC)^{1/2}$ of an LC tank circuit which determines the oscillation frequency is changed in accordance with the total capacitance due to the switching (on) of the transistors M1 to M7. Therefore, a time until an oscillation amplitude has reached to a steady state may not coincide to the total sum value of the capacitors (total capacitance value $1C_0$ to $7C_0$), and is also a problem.

Therefore, in the pulse generator depicted in FIG. 10, the oscillation-start-trigger signals OST, /OST are input to gates of the differential pair transistors 31 and 32, and the pulse generator is forced to start oscillation by the trigger signals OST, /OST with reducing the delay time Td.

Specifically, as depicted in FIG. 12, by forcibly exciting the oscillation of each of the frequencies f1 to f7 by oscillation-start-trigger signal OST (/OST), the time for reaching the oscillation to a steady state may be shortened.

Further, by using the oscillation-start-trigger signal OST, an influence for due to the differences in impedance of the LC tank circuits may be reduced. Specifically, even though a total capacitance value is different, the time until the oscillation amplitude is reached to a steady state may substantially coincide.

Note that, the timing of switching the transistors M1 to M7 according to the data Data 1 to Data 7 may be preferably in the same timing as the oscillation-start-trigger signal OST (/OST). Therefore, in FIG. 10, the data is read at the clock input timing by using delay flip-flops FF1 to FF7, so as to control the switching of the transistors M1 to M7.

Specifically, as depicted in FIG. 12, the data Data 1 to Data 7 from the baseband circuit 1 are read at a rising edge of the oscillation-start-trigger signal OST, so that the total capacitance may be always updated at the same time as the rising edge of the oscillation-start-trigger signal.

Incidentally, as depicted in FIG. 12, for example, when generating a three-bit data, eight states (8 patterns) may be set to different seven kinds of frequencies f1 to f7 and the oscillation stop state.

Figure 13:
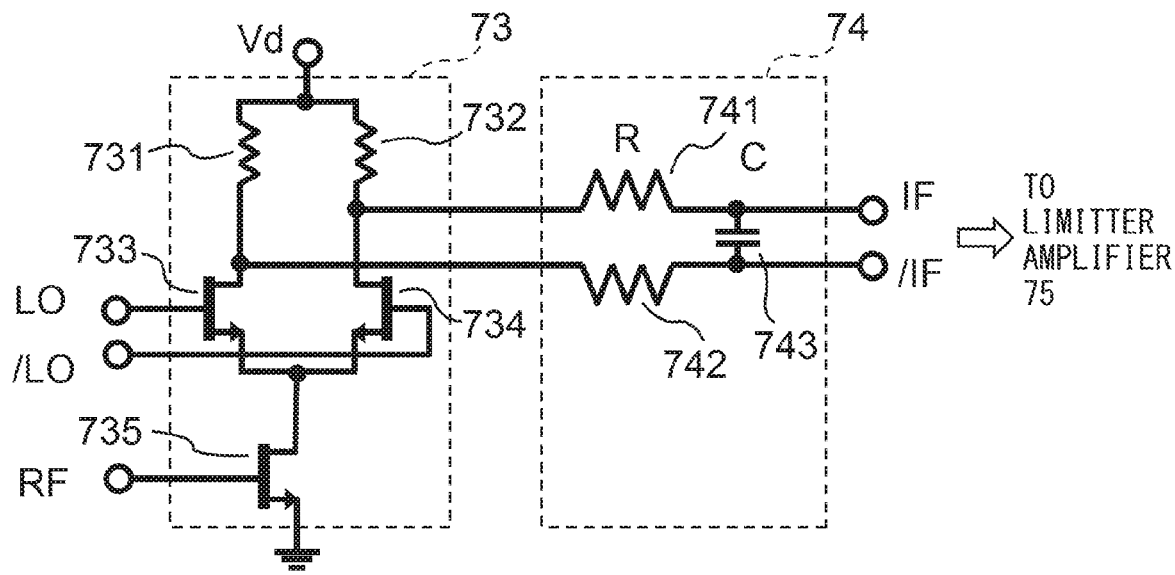
FIG. 13 is a circuit diagram illustrating an example of a receiver correlator in the transceiver depicted in FIG. 9.

FIG. 13 is a circuit diagram illustrating an example of a receiver correlator in the transceiver depicted in FIG. 9, and indicates the mixer circuit 73 and the low-pass filter 74 depicted in above described FIG. 9. Note that, in FIG. 13, the signal flow is in the opposite direction from that of FIG. 9.

As depicted in FIG. 13, the mixer circuit 73 demodulates the received RF (high-frequency signal) at local LO, /LO, and outputs to the low-pass filter 74. The low-pass filter 74 generates IF, /IF (intermediate frequency) and outputs to the IF amplifier 75.

The mixer circuit 73 is a differential amplifier including resistors 731 and 732, and nMOS transistors 733 to 735. The low-pass filter 74 includes resistors 741 and 742 arranged in series with the differential inputs, and a capacitor 743. The capacitor 743 is provided between the differential outputs (IF, /IF) of the low-pass filter 74.

Note that the local LO (/LO) is selected the highest frequency f1 or the lowest frequency f7 among the frequencies f1 to f7 to be used for the burst pulses. The reception correlator (mixer circuit 73 and low-pass filter 74) depicted in FIG. 13 is only example, and may be applied to various types of devices. Specifically, various types of devices using diodes or transistors used for a mixer circuit were previously known, and it is possible to apply them as the mixer circuit 73 of the present embodiment.

The low-pass filter 74 removes high frequency components in the baseband pulse RF or the local LO, and only passes an intermediate frequency signal IF of low-frequency components. Therefore, the resistor R and the capacitor C in the low-pass filter 74 may be designed to satisfy the conditions that a cut-off frequency defined by fcut-off=$1/2\pi RC$ is, f(IF)<fcut-off<f(LO, RF) and so that It is preferred to.

Figure 14:
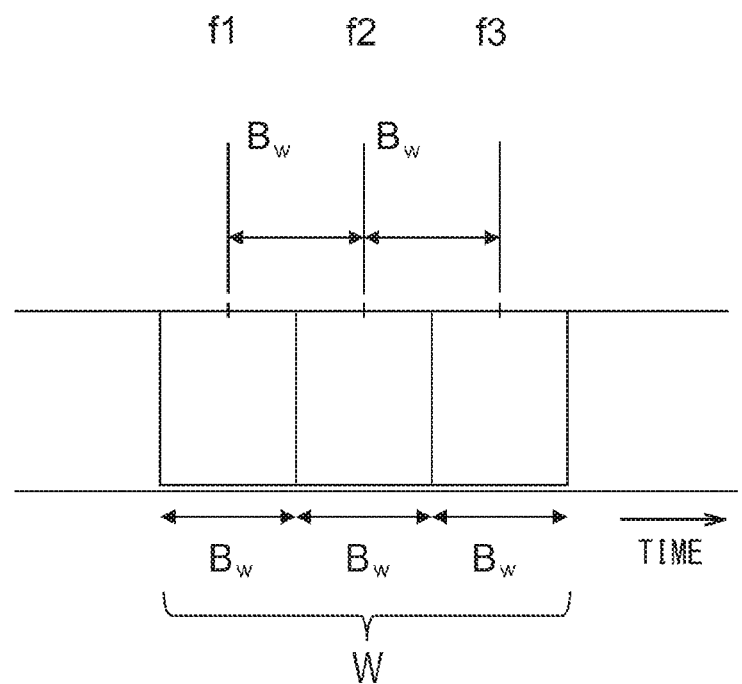
FIG. 14 is a diagram illustrating an example of frequency relationships in a wireless data transmission method of the present embodiment.

FIG. 14 is a diagram illustrating an example of frequency relationships in a wireless data transmission method of the present embodiment, and indicates the case of dividing the band (full band) W to be used into three sub-bands, and assigning different frequencies f1 to f3 thereto, respectively.

Specifically, FIG. 14 indicates the case wherein two-bit multi-value data are represented by four states including different three kinds of burst pulses of burst oscillating at three different frequencies f1 to f, and no burst pulse state (oscillation stop state).

In this case, a pulse time width (width of an envelope of the burst pulse) T of burst oscillating is defined by T=1/Bw, and an interval of frequencies of the adjacent sub-bands is set to the same as Bw or an integer multiples of Bw.

Figure 15:
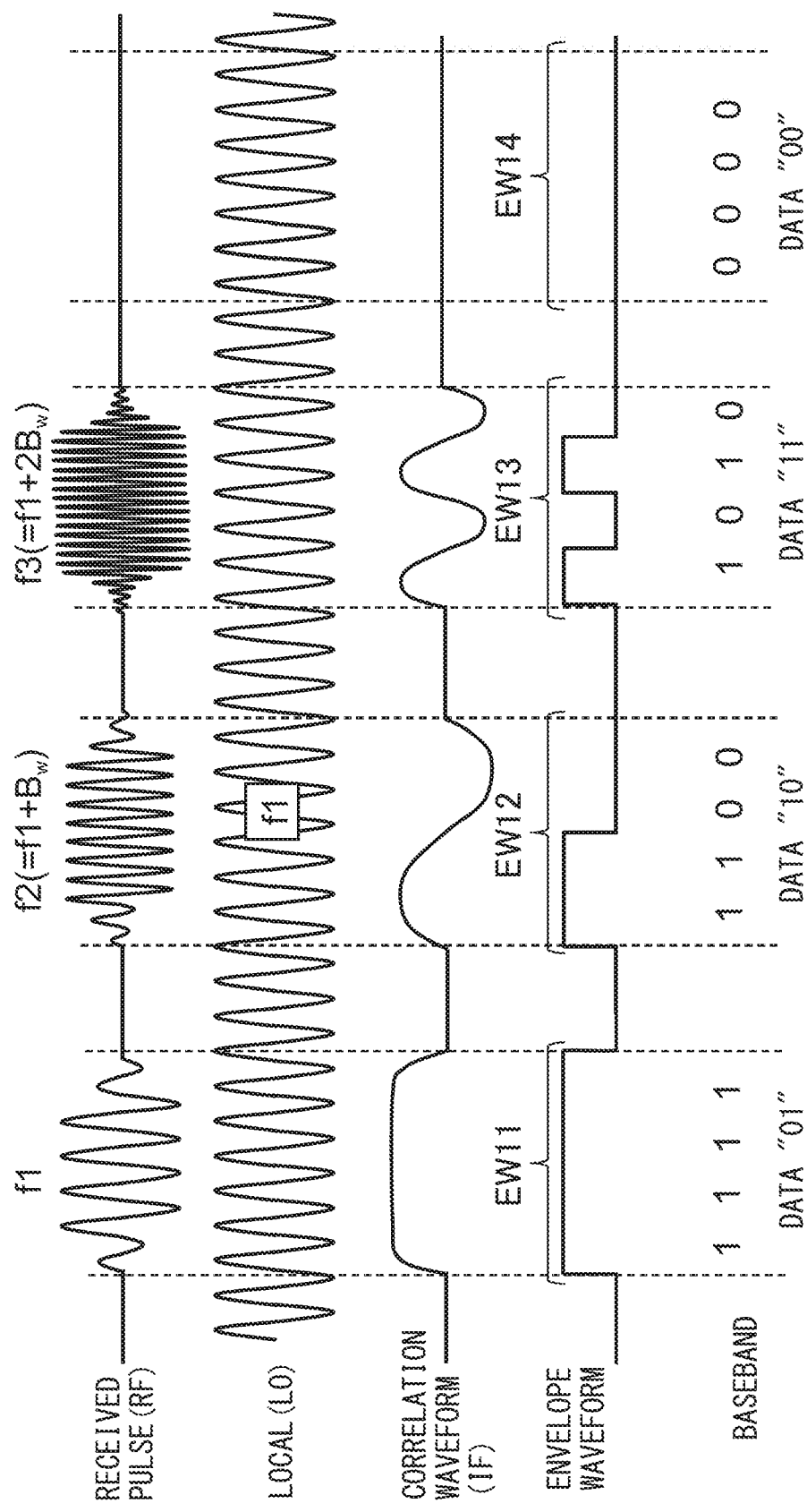
FIG. 15 is a diagram for explaining an example of a demodulation in the wireless data transmission method of the present embodiment.
Figure 16:
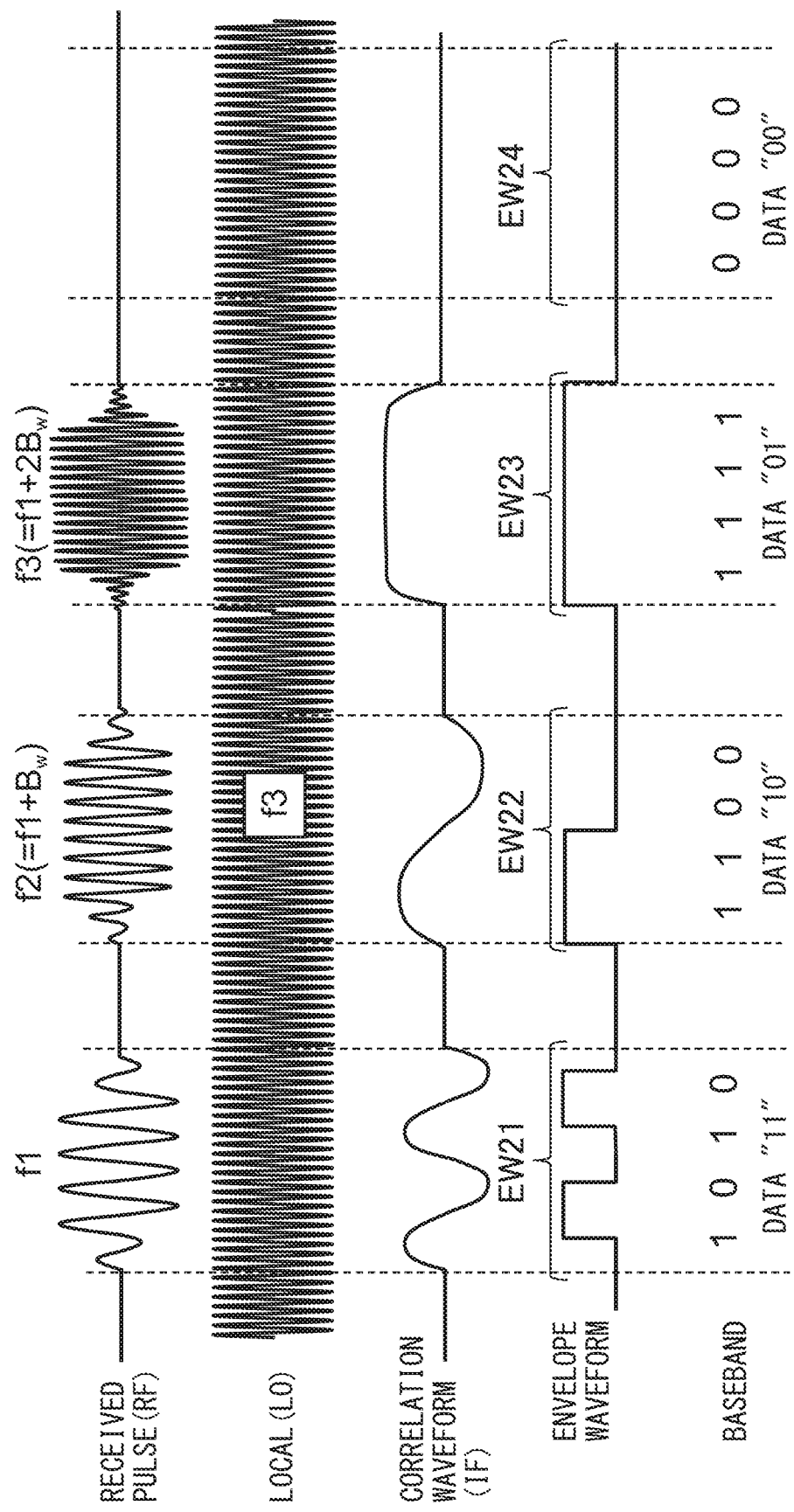
FIG. 16 is a diagram for explaining another example of the demodulation in the wireless data transmission method of the present embodiment.

FIG. 15 and FIG. 16 explain a demodulation operation to be performed by receiving signals (pulses) when the oscillation stop state and the three different frequencies f1, f2 and f3, are and If you are assigned to two-bit multi-value data "00", "01", "10" and "11".

FIG. 15 is a diagram for explaining an example of a demodulation in wireless data transmission method of the present embodiment, as a local LO, among the frequencies f1 to f3, indicates a case of demodulating by using the lowest frequency f1. The distance between frequencies f1, f2 and f3 is set to an integer multiple of the ratio of the sub-band.

For example, a high-frequency signal received through a low-noise amplifier 70 of FIG. 9 described above (baseband pulse) RF, and the local (local oscillation signal) LO and the mixing by the mixer circuit 73, the correlation waveform (intermediate frequency signal) IF, such as depicted in FIG. 15 is obtained. The correlation waveform IF, by amplifying an IF amplifier (limiter amplifier) 75, a demodulation waveform, the envelope waveform of only the envelope portion is extracted as depicted in FIG. 15 is obtained.

The frequency of the local LO is the lowest frequency f1 among the frequencies f1 to f3, for example, if the local LO of the frequency f1 is the same as the frequency (f1) of the received pulsed RF, an envelope including the same time width as the pulse width is obtained. Specifically, if the envelope waveform is the same time width of the received pulse width (EW11), the received data is judged to "01".

On the other hand, the local LO of the frequency f1 is different from that of the receiving pulsed RF, a beat waveform may be appeared with calculating by f(RF)−f(LO). Note that, distances among the frequencies f1, f2 and f3, are set to ratios of an integer multiple of Bw, and therefore if the envelope waveform is one peak of the beat pulse (EW12), f1 and f2 is one time Bw, and the received data is judged to "01".

Further, if the envelope waveform is two peaks of the beat pulse (EW13), f1 and f3 is two times Bw, and the received data is judged to "11". Note that, if the envelope waveform is not obtained (maintained to zero: EW14), it is an oscillation stop state, and the received data is judged to "00".

Note that, in FIG. 9 described above, an envelope waveform generated by the receiving section 7 is output to a baseband circuit 1, and the number of peaks of the envelope waveform is counted by the baseband circuit 1 and the received data is judged.

In the mixing of the local LO and the received pulse RF, when it is correlated with the frequency f1 and the frequency f1, the phase difference generally exists between LO and RF. When describing the phase difference as θ, the correlation waveform IF is Sin(θ) and includes an offset voltage.

Further, in the mixing of the local LO and the received pulse RF, when it is correlated with the frequency f1 and the non-pulse (oscillation stop state), the correlation waveform IF is only output a voltage of a zero level. Specifically, so as to identify a correlation of [f1]×[f1] and a correlation of [f1]×[non-pulse], Sin(θ) may include a sufficient offset. For example, when the Sin(θ)=0, it is difficult to identify a non-pulse reception (oscillation stop state).

Therefore, the low-noise amplifier 70 of FIG. 9 described above, may insert the variable phase shifter 72 to the path of the local LO, as an input of the IF amplifier 75 (baseband circuit 1) is Sin (θ) to 1 by adjusting the phase amount.

Note that, in this process of adjusting the phase amount by the variable phase shifter 72, for example, at the time of starting communication, it is preferable to use a pilot signal that alternatively repeats the non-pulse state and the burst pulse by frequency f1.

Therefore, by counting the number of peaks in the envelope waveform, it is possible to identify that the received pulse is what kind of oscillation frequency, that is, the received pulse is what kind of pulse burst oscillating what kind of frequency included in a sub-band or the oscillation stop state.

Note that the judgement processing of the received data is not limited to counting the number of peaks in the above-mentioned envelope waveform, for example, may be applied to various techniques by detection of the rising edge and pulse width of the envelope waveform.

FIG. 16 is a diagram for explaining another example of the demodulation in the wireless data transmission method of the present embodiment, and indicates the case of demodulating by using the highest frequency f3 among frequencies f1, f2 and f3 as the local LO. Note that an interval of the frequencies f1 to f3 is set to a ratio of an integer multiple of the sub-band.

As is apparent from a comparison of FIG. 15 and FIG. 16 described above, when using the highest frequency f3 as the local LO, if the envelope waveform is the same time width as the received pulse width (EW23), the received data is judged to received data "01".

Further, if the envelope waveform is one peak of a beat pulse (EW21), f3 and f2 become one time of Bw, and the received data is judged to "01". In addition, if the envelope waveform is two peaks of the beat pulse (EW21), f3 and f2 become two times of Bw, and the received data is judged to "11". Further, if the envelope waveform is not obtained (maintained to zero: EW24), it is an oscillation stop state, and the received data is judged to "00".

Note that, the other processes, etc., are the same processes as described with reference to FIG. 15. Further, the assignments of the two-bit multi-value data "00", "01", "10", "11", and the oscillation stop state and the three different frequencies f1, f2 and f3 are not limited to those described above.

Further, in FIG. 14 to FIG. 16, the descriptions are performed by explaining an example of the two-bit multi-value data, but the descriptions may be the same in the case of three bits or more, in any case, at least two kinds of burst pulses of two different frequencies and an oscillation stop state (non-pulse) may be used as transmitting data.

Figure 17:
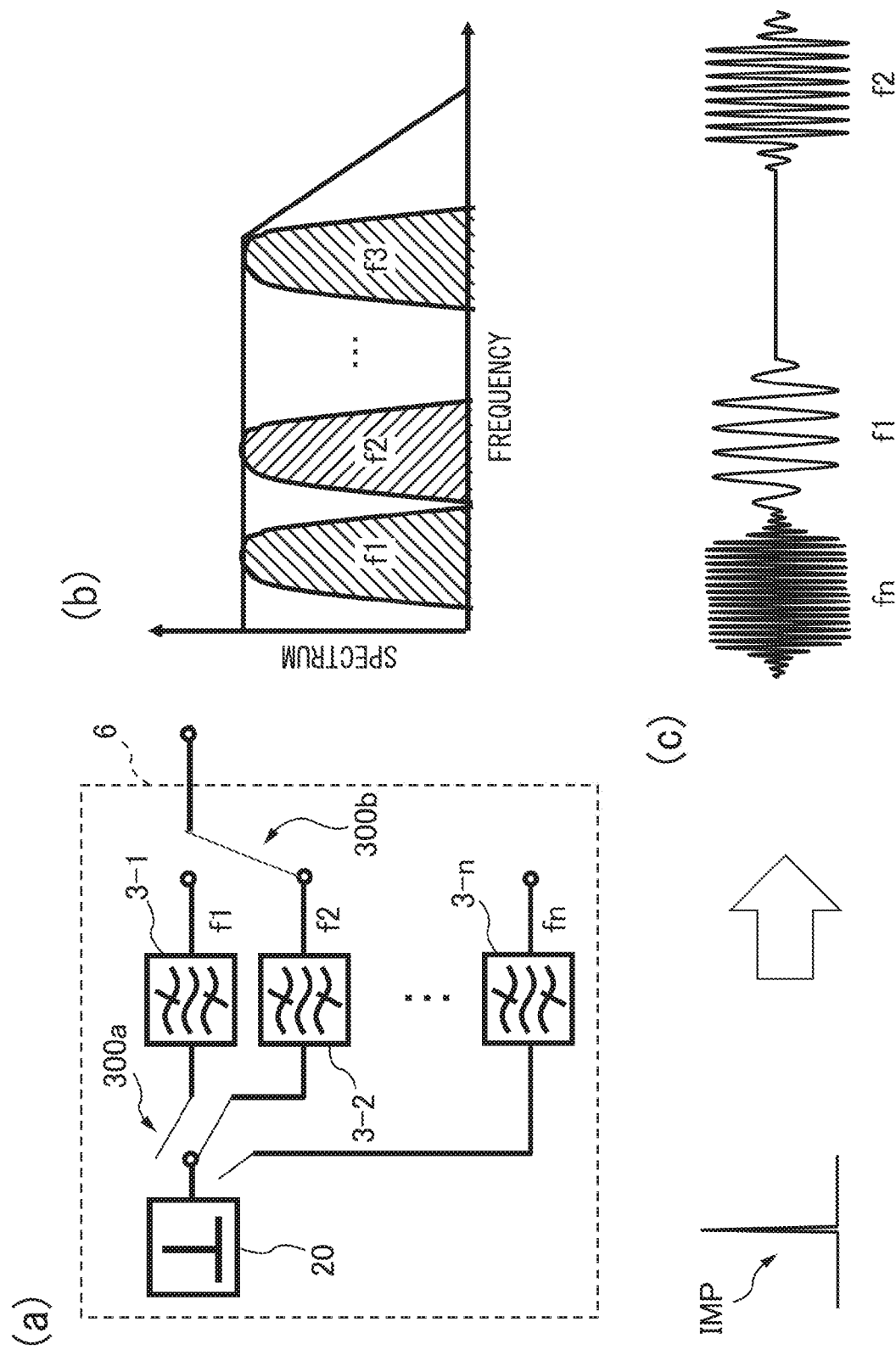
FIG. 17 is a diagram for explaining a third embodiment of the pulse generator.

FIG. 17 is a diagram for explaining a third embodiment of the pulse generator, FIG. 17(a) indicates a block diagram of the pulse generator of the third embodiment, and FIG. 17(b) indicates frequencies of the burst pulses generated by the pulse generator depicted in 17(a). Further, FIG. 17(c) is a diagram for explaining an operation of the pulse generator depicted in FIG. 17(a).

As depicted in FIG. 17(a), a pulse generator 6 of the third embodiment includes an impulse generator circuit 20, and band pass filters 3-1 to 3-n for generating burst impulses by the frequencies f1 to fn, respectively. Note that, the impulse generated by the impulse generator circuit 20 has a wide frequency spectrum, and ideally the time width is a signal of 0s.

As depicted in FIG. 17(b), an impulse generated by such an impulse generator circuit 20, by passing the band-pass filters 3-1 to 3-n, respectively, and burst pulses by the frequency f1 to fn may be obtained.

Note that, the respective band-pass filter 3-1 to 3-n may be realized by applying an amplifier including a predetermined band characteristic to a semiconductor integrated circuit (semiconductor chip). It is also possible to use an external device of the semiconductor chip.

Further, in response to the burst pulse by the frequency output from the pulse generator 6, one of the band-pass filters 3-1 to 3-n may be selected by controlling connections of inputs and outputs of the band-pass filters by switches 300a and 300b.

Note that, the impulse generator circuit 20 and band-pass filters 3-1 to 3-n, for example, correspond to the burst oscillation circuit 3 described with reference to FIG. 10, and the switches 300a and 300b correspond to the burst control signal generation circuit (control circuit) 2.

Therefore, for example, it is possible to generate and output a burst pulse by a frequency corresponding to the data from the baseband circuit 1. Note that, in the pulse generator 6 of the third embodiment, the oscillation stop state may be utilized, and therefore, it is possible to perform data transmission in the multi-level (n+1). The oscillation stopped state may be realized by not connecting to any of the band-pass filters by the switches 300a and 300b.

FIG. 18 is a diagram for explaining an effect of each embodiment of the pulse generator, FIG. 18(a) indicates the relationship between the band (full band) W and the sub-band Bw to be used, and FIG. 18(b) indicates the relationship between the number of sub-band and the transmission rate.

As depicted in FIG. 18(a), the full band W is divided into N sub-bands assigned N frequencies F1 to FN different for each of the sub-bands. Therefore, it is possible to transmit data corresponding to N+1 states by N burst pulses of frequencies F1 to FN and an oscillation stop state.

As depicted by a characteristic curve CL11 of FIG. 18(b), by considering an impulse mode wireless data transmission method using one sub-band Bw, a transmission rated may be indicated by 1×Bw [bit/s].

Further, as depicted by a characteristic curve CL12, by considering an impulse mode wireless data transmission method using a full band W of N×Bw, a transmission rated may be indicated by N×Bw [bit/s]. Note that, as depicted by a characteristic curve CL13, which is a carrier modulation type, a transmission rated may be indicated by $Log_2(N)$ [bit/s], as explained with reference to FIG. 5.

In contrast, according to the wireless data transmission method of applying the pulse generators for each of the foregoing embodiments (wireless data transmission method of the present embodiments), as depicted by a characteristic curve CL14, a transmission rate may be indicated by $Log_2(N+1)$ [bit/s].

Therefore, in FIG. 18(b), the highest transmission rate (transmission speed) is the impulse mode wireless data transmission method using N×Bw depicted by the characteristic curve CL11, which is based on ideal conditions without being limited to device performance.

However, at the present, for example, the realization of a full band N×Bw of 57 GHz to 66 GHz band or 80 GHz to 90 GHz band described above is difficult, and the transmission rate may be very low (e.g., about Bw [bit/s]). Specifically, as depicted by the characteristic curve CL11, since the number of dividing a full band W into sub-bands Bw is limited, and thus it is difficult to improve the transmission rate.

In contrast, as depicted by the characteristic curve CL14, in accordance with the wireless data transmission method of the present embodiments, along with the burst pulse for each frequency, it is possible to use the oscillation stop state for data transmission, in addition to data transmission of burst pulses by respective frequencies, and therefore it is possible to increase the transmission rate than that indicated by the characteristic curve CL13.

Furthermore, the wireless data transmission method of the present embodiments, the burst pulse of each frequency is always started from a reset level (zero level), and therefore it is possible to realize stable data transmission without occurring an intersymbol-interference due to frequency fluctuation.

While the embodiment has been described above, all examples and conditional language recited herein are intended to aid the reader in understanding the concept of the present invention applied to the invention and the technique. Such specifically recited examples and conditions are not to be construed as limiting the scope of the invention nor do the configurations of the examples herein indicate merits and demerits of the invention. Although the embodiment of the invention has been detailed, it is to be understood that various changes, replacements, and modifications can be made thereto without departing from the spirit and the scope of the invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A pulse generator configured to generate a burst pulse formed by burst oscillation signals oscillated in a predetermined time period, comprising:
a burst oscillation circuit configured to generate the burst oscillation signals of different frequencies; and
a control circuit configured to control the burst oscillation circuit so as to select the frequencies of the burst oscillation signals from at least two different frequencies or to stop the burst oscillation signals, wherein
the burst oscillation circuit includes a plurality of oscillators configured to oscillate the different frequencies, and
the control circuit includes a plurality of oscillator output select switches configured to select one of outputs of the plurality of oscillators.

2. The pulse generator as claimed in claim 1, wherein the pulse generator further comprises:
an oscillation-start-trigger generation circuit configured to generate an oscillation-start-trigger signal which forcibly starts oscillation of the burst oscillation circuit.

3. The pulse generator as claimed in claim 1, wherein the control circuit includes:
a burst control signal generation circuit configured to generate a burst control signal which controls an oscillation state of the burst oscillation circuit.

4. The pulse generator as claimed in claim 1, wherein the oscillator and the oscillator output select switch are unitized to a single frequency in each of the plurality of different frequencies.

5. The pulse generator as claimed in claim 1, wherein when stopping the burst oscillation signal, all of the oscillator output select switches are non-selected.

6. A pulse generator as claimed in claim 1, configured to generate a burst pulse formed by burst oscillation signals oscillated in a predetermined time period, comprising:
a burst oscillation circuit configured to generate the burst oscillation signals of different frequencies; and
a control circuit configured to control the burst oscillation circuit so as to select the frequencies of the burst oscillation signals from at least two different frequencies or to stop the burst oscillation signals, wherein
the burst oscillation circuit is a differential amplifier circuit, and the differential amplifier circuit includes:
a first and second transistors, which are cross-coupled and differential, configured to perform oscillation; and
an oscillation state control switch configured to control the oscillation state of the burst oscillation circuit by a burst control signal, wherein
the oscillation state control switch is provided between differential terminals of the differential amplifier circuit, and
when stopping the burst oscillation signal, the oscillation state control switch is switched on by the burst control signal.

7. A pulse generator configured to generate a burst pulse formed by burst oscillation signals oscillated in a predetermined time period, comprising:
a burst oscillation circuit configured to generate the burst oscillation signals of different frequencies; and
a control circuit configured to control the burst oscillation circuit so as to select the frequencies of the burst oscillation signals from at least two different frequencies or to stop the burst oscillation signals, wherein
the burst oscillation circuit includes:
an impulse generation circuit configured to generate an impulse; and
a plurality of band-pass filters configured to generate the plurality of different frequencies by passing the generated impulse.

8. The pulse generator as claimed in claim 7, wherein the control circuit includes a filter output select switch configured to select one of the outputs of the band-pass filters.

9. A semiconductor integrated circuit comprising:
a pulse generator configured to generate a burst pulse formed by burst oscillation signals oscillated in a predetermined time period, including a burst oscillation circuit configured to generate the burst oscillation signals of different frequencies, and a control circuit configured to control the burst oscillation circuit so as to select the frequencies of the burst oscillation signals from at least two different frequencies or to stop the burst oscillation signals; and
a baseband circuit configured to process data and input the processed data to the burst control signal generation circuit, wherein
the burst oscillation circuit includes a plurality of oscillators configured to oscillate the different frequencies, and
the control circuit includes a plurality of oscillator output select switches configured to select one of outputs of the plurality of oscillators.

10. A wireless data transmission method for wirelessly performing a data transmission by presence or absence of a burst pulse formed by burst oscillation signals which are oscillated in a predetermined time period, the wireless data transmission method comprising:
setting a frequency of each of the burst oscillation signals to any one of a plurality of different frequencies; and
performing the data transmission corresponding to the presence or absence of the burst pulse, and the plurality of different frequencies of the burst oscillation signals, wherein the wireless data transmission method further comprises:
dividing a band to be used into a plurality of sub-bands; and
assigning the plurality of different frequencies to the divided sub-bands, respectively.

11. The wireless data transmission method as claimed in claim 10, wherein
an interval of frequencies of adjacent sub-bands is set to the same interval of the sub-band or an integral multiplication of the sub-bands.

12. The wireless data transmission method as claimed in claim 10, wherein
when receiving the burst pulse,
demodulating the burst pulse by using the lowest frequency or the highest frequency in the plurality of different frequencies, using the lowest frequency or the highest frequency.

* * * * *